US012107055B2

(12) United States Patent
Hsu et al.

(10) Patent No.: US 12,107,055 B2
(45) Date of Patent: Oct. 1, 2024

(54) ELECTRONIC PACKAGE AND FABRICATION METHOD THEREOF

(71) Applicant: SILICONWARE PRECISION INDUSTRIES CO., LTD., Taichung (TW)

(72) Inventors: Chih-Hsun Hsu, Taichung (TW); Chi-Jen Chen, Taichung (TW); Hsi-Chang Hsu, Taichung (TW); Yuan-Hung Hsu, Taichung (TW); Rui-Feng Tai, Taichung (TW); Don-Son Jiang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 18/109,120

(22) Filed: Feb. 13, 2023

(65) Prior Publication Data

US 2023/0187382 A1    Jun. 15, 2023

Related U.S. Application Data

(62) Division of application No. 17/160,749, filed on Jan. 28, 2021, now Pat. No. 11,610,850.

(30) Foreign Application Priority Data

Nov. 27, 2020   (TW) .................................. 109141729

(51) Int. Cl.
*H01L 23/00*   (2006.01)
*H01L 21/48*   (2006.01)
(Continued)

(52) U.S. Cl.
CPC ........ *H01L 23/562* (2013.01); *H01L 21/4853* (2013.01); *H01L 21/56* (2013.01); *H01L 23/3157* (2013.01); *H01L 24/05* (2013.01); *H01L 25/0655* (2013.01); *H01L 25/50* (2013.01); *H01L 24/16* (2013.01); *H01L 2224/05556* (2013.01); *H01L 2224/16227* (2013.01)

(58) Field of Classification Search
CPC ... H01L 23/562; H01L 21/4853; H01L 21/56; H01L 23/3157; H01L 24/05; H01L 25/0655; H01L 25/50
See application file for complete search history.

(56) References Cited

U.S. PATENT DOCUMENTS 11,309,228 B2 * 4/2022 Kim .................... H01L 25/0652
2021/0104446 A1 * 4/2021 Kim ..................... H01L 23/367
(Continued)

*Primary Examiner* — Thao P Le
(74) *Attorney, Agent, or Firm* — Studebaker & Brackett PC

(57) ABSTRACT

An electronic package is provided and includes at least one protective structure positioned between a first electronic element and a second electronic element on a carrier for reducing stresses generated inside the first electronic element and the second electronic element when a filling material is formed on the carrier, encapsulates the protective structure and comes into contact with the first electronic element and the second electronic element, thereby preventing cracking of the first electronic element and the second electronic element and improving the reliability of the electronic package.

10 Claims, 7 Drawing Sheets

(51) Int. Cl.
  *H01L 21/56* (2006.01)
  *H01L 23/31* (2006.01)
  *H01L 25/00* (2006.01)
  *H01L 25/065* (2023.01)

(56) References Cited

U.S. PATENT DOCUMENTS

2021/0408109 A1    12/2021  Ang
2022/0005796 A1     1/2022  Ang
2022/0020940 A1     1/2022  Park
2022/0173052 A1     6/2022  Hsu
2022/0181225 A1*    6/2022  Chen ................... H01L 23/5385

* cited by examiner

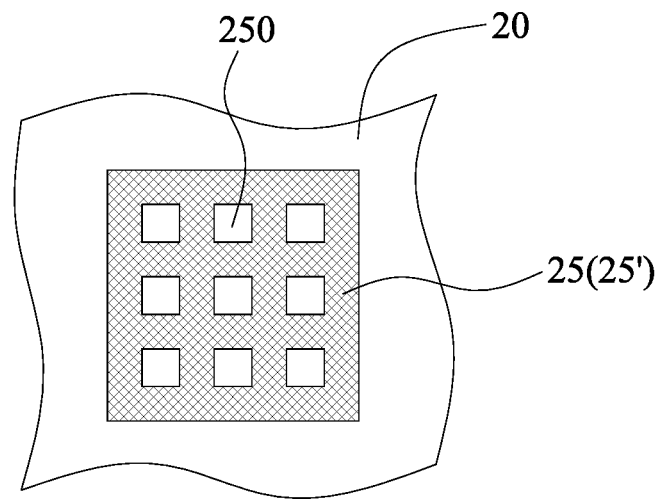
FIG. 2A'
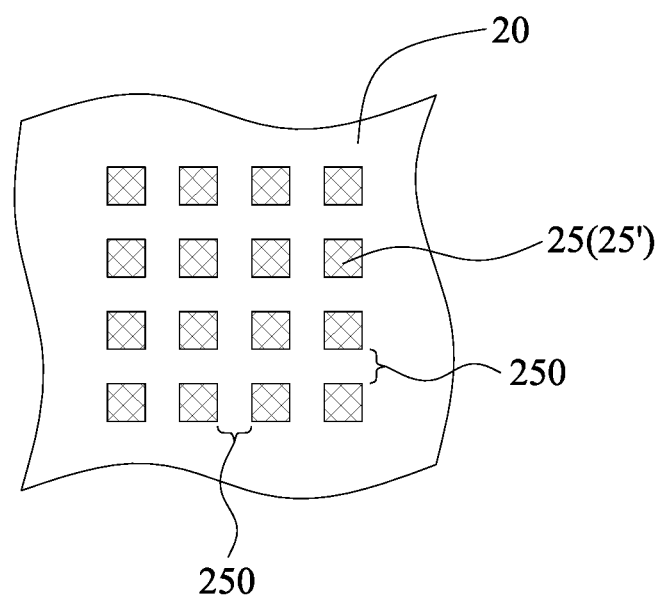
FIG. 2A"

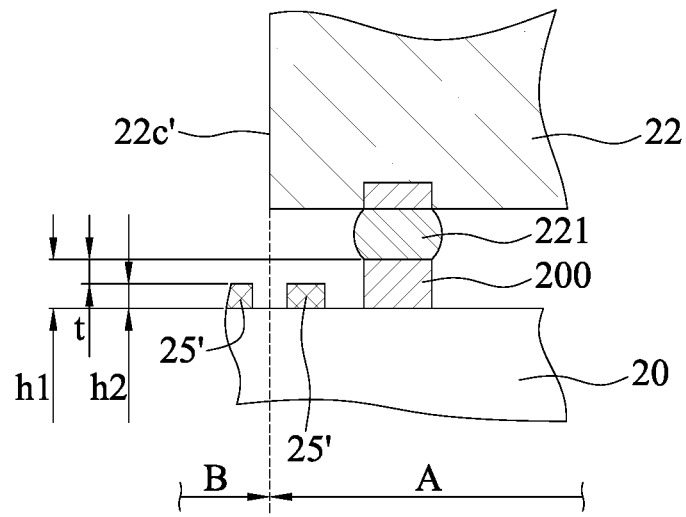
FIG. 2C'
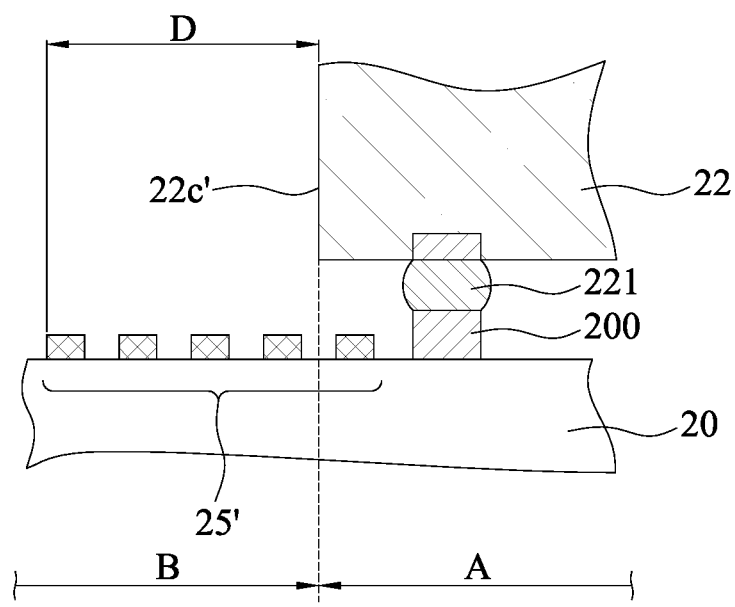
FIG. 2C"

ELECTRONIC PACKAGE AND FABRICATION METHOD THEREOF

This is a divisional of co-pending U.S. Ser. No. 17/160,749, filed Jan. 28, 2021 which claims priority to Taiwan Application Serial No. 109141729, filed Nov. 27, 2020. The present disclosure relates to electronic packages and fabrication methods thereof, and more particularly, to a multi-chip electronic package and a fabrication method thereof.

BACKGROUND

1. Technical Field

2. Description of Related Art

Along with the progress of technology, the demand for electronic products with heterogeneous integration has increased. Therefore, multi-chip packaging structures (MCM/MCP) have been developed.

FIG. 1 is a schematic cross-sectional view of a conventional multi-chip packaging structure 1. Referring to FIG. 1, a plurality of semiconductor chips 11 are bonded onto a packaging substrate 10 through a plurality of solder bumps 13, and an encapsulant 14 is formed to encapsulate the plurality of semiconductor chips 11. By packaging the plurality of semiconductor chips 11 into a single module, more I/O counts can be provided, the computing power of processors can be greatly increased and signal transmission delay can be reduced. Therefore, such a packaging structure is applicable to high-end products with high-density circuits, a high transmission speed, a large number of stack layers or a large size design.

However, when the multi-chip packaging structure 1 is packaged, the encapsulant 14 may be formed on corners of the semiconductor chips 11 or edges of inactive surfaces 11b of the semiconductor chips 11, and the encapsulant 14 has a relatively large Young's modulus, thereby increasing internal stresses of the semiconductor chips 11 and causing stress concentration of the semiconductor chips 11. Consequently, cracking may occur to the encapsulant 14 and extend to the semiconductor chips 11, thus reducing the reliability of the multi-chip packaging structure 1.

Therefore, how to overcome the above-described drawbacks of the prior art has become an urgent issue in the art.

SUMMARY

In view of the above-described drawbacks, the present disclosure provides an electronic package, which comprises: a carrier; a first electronic element and a second electronic element intervally disposed on the carrier with a space formed between the first electronic element and the second electronic element; a protective structure disposed on the carrier and positioned between the first electronic element and the second electronic element; and a filling material formed on the carrier and in the space and encapsulating the protective structure.

The present disclosure further provides a method for fabricating an electronic package, the method comprising: disposing a first electronic element and a second electronic element intervally on a carrier having a protective structure, wherein a space is formed between the first electronic element and the second electronic element, and the protective structure is positioned between the first electronic element and the second electronic element; and forming a filling material on the carrier and in the space and encapsulating the protective structure.

In the above-described package and method, the first electronic element and the second electronic element are electrically connected to the carrier.

In the above-described package and method, the protective structure is a metal structure.

In the above-described package and method, the protective structure is in a form of a mesh or a plurality of blocks.

In the above-described package and method, the protective structure has at least one hollow portion exposing the carrier.

In the above-described package and method, the carrier has a plurality of conductive pads electrically connected to the first electronic element and/or the second electronic element, and a height of the conductive pads relative to a surface of the carrier is greater than a height of the protective structure relative to the surface of the carrier.

In the above-described package and method, the carrier is defined with a chip mounting region and a peripheral region surrounding the chip mounting region, such that the first electronic element and the second electronic element are disposed in the chip mounting region and the protective structure is further disposed on the peripheral region. For example, a layout area of the protective structure is greater than a vertical projection area of the first electronic element on the carrier and/or a vertical projection area of the second electronic element on the carrier.

The above-described package and method can further comprise an encapsulant formed on the carrier for encapsulating the first electronic element and the second electronic element. For example, the first electronic element and/or the second electronic element are exposed from the encapsulant.

According to the electronic package and the fabrication method thereof of the present disclosure, the protective structure is positioned between the first electronic element and the second electronic element on the carrier so as to disperse stress distribution, thereby reducing stresses generated inside the first electronic element and the second electronic element by the filling material. Compared with the prior art, the present disclosure prevents cracking of the first electronic element and the second electronic element and improves the reliability of the electronic package.

BRIEF DESCRIPTION OF THE DRAWINGS

FIGS. 2A' and 2A" are schematic partial upper views showing various embodiments of FIG. 2A.

FIGS. 2C' and 2C" are schematic partially enlarged cross-sectional views of the structure before a flip-chip reflow process of FIG. 2C.

FIG. 2D' is a schematic cross-sectional view showing another embodiment of FIG. 2D.

DETAILED DESCRIPTION

The following illustrative embodiments are provided to illustrate the present disclosure, these and other advantages and effects can be apparent to those skilled in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

FIGS. 2A to 2D are schematic cross-sectional views illustrating a method for fabricating an electronic package 2 according to the present disclosure.

Figure 1:
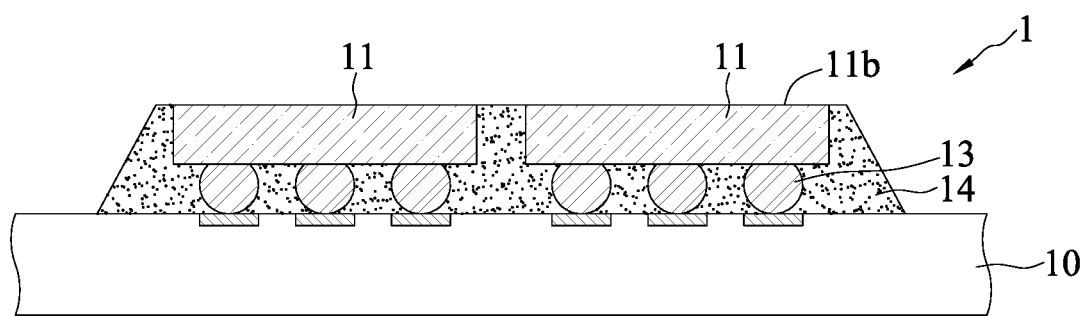
FIG. 1 is a schematic cross-sectional view of a conventional multi-chip packaging structure.
Figure 2A:
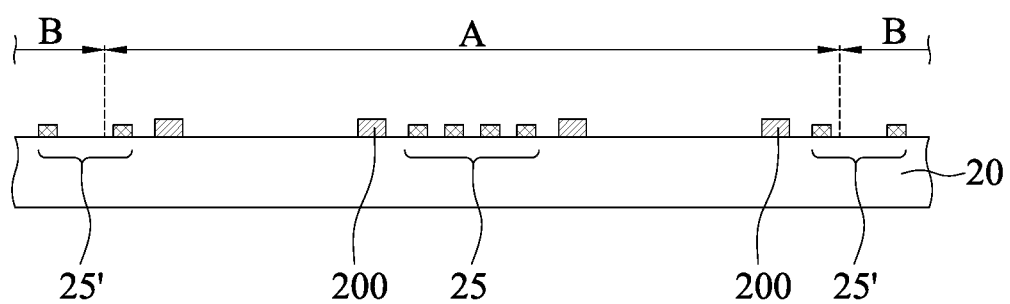
FIGS. 2A to 2D are schematic cross-sectional views illustrating a method for fabricating an electronic package according to the present disclosure.

Referring to FIG. 2A, a carrier 20 is provided, and at least one protective structure 25, 25' is provided on the carrier 20.

In an embodiment, the carrier 20 is a packaging substrate having a core layer and a circuit structure, or a coreless circuit structure. For example, the circuit structure has at least one dielectric layer and a redistribution layer formed on the dielectric layer. The redistribution layer is made of copper and the dielectric layer is made of such as polyimide (PI), polybenzoxazole (PBO), prepreg (PP), a molding compound, a photosensitive dielectric layer or the like and formed by coating. In other embodiments, the carrier 20 can be a semiconductor substrate having a plurality of conductive through-silicon vias (TSVs) for serving as a through silicon interposer (TSI). Alternatively, the carrier 20 can be other carrier units for carrying electronic elements such as chips. For example, the carrier 20 is a lead frame, but the present disclosure is not limited as such.

Further, the carrier 20 is defined with a chip mounting region A and a peripheral region B surrounding the chip mounting region A. For example, the redistribution layer is formed on the chip mounting region A and has a plurality of conductive pads 200 such as micro pads (u-pads) formed on a surface of the chip mounting region A. The peripheral region B can be configured with or without circuits according to the practical need.

Furthermore, the protective structure 25 is disposed in the chip mounting region A, and the protective structure 25' can be disposed on the peripheral region B as needed. For example, a portion of the protective structure 25' can be disposed inside an edge of the chip mounting region A. In other words, the protective structure 25, 25' can be disposed on the carrier 20 except the region with circuits. Alternatively, the protective structure 25, 25' is only formed on specific regions.

In addition, the protective structure 25, 25' is a metal structure. The protective structures 25, 25' can be in the form of a copper mesh, as shown in FIG. 2A', or a plurality of copper blocks (dams) spaced from one another (e.g., intervally arranged), as shown in FIG. 2A".

Figure 2B:
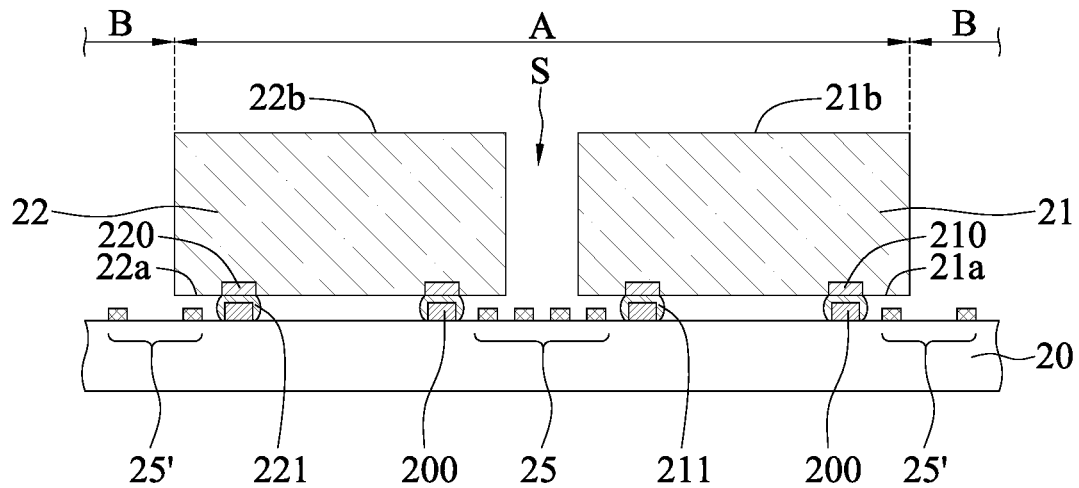

Referring to FIG. 2B, at least one first electronic element 21 and at least one second electronic element 22 are intervally disposed on the chip mounting region A of the carrier 20 in a manner that a space S is formed (defined) between the first electronic element 21 and the second electronic element 22, and the protective structure 25 is positioned between the first electronic element 21 and the second electronic element 22.

In an embodiment, the first electronic element 21 is an active element such as a semiconductor chip, a passive element such as a resistor, a capacitor or an inductor, a packaging structure, or a combination thereof. For example, the first electronic element 21 is a semiconductor chip, which has an active surface 21a with a plurality of electrode pads 210 and an inactive surface 21b opposite to the active surface 21a. A plurality of conductive bumps 211 are formed on the electrode pads 210 for flip-chip bonding and electrically connecting the first electronic element 21 onto the conductive pads 200 of the carrier 20.

Further, the second electronic element 22 is an active element such as a semiconductor chip, a passive element such as a resistor, a capacitor or an inductor, a packaging structure, or a combination thereof. For example, the second electronic element 22 is a semiconductor chip, which has an active surface 22a with a plurality of electrode pads 220 and an inactive surface 22b opposite to the active surface 22a. A plurality of conductive bumps 221 are formed on the electrode pads 220 for flip-chip bonding and electrically connecting the second electronic element 22 to the conductive pads 200 of the carrier 20. It should be understood that the first electronic element 21 and the second electronic element 22 can be of the same type of electronic elements (i.e., active elements), and have identical or different internal structures. Alternatively, the first electronic element 21 and the second electronic element 22 can be of different types of electronic elements. For example, the first electronic element 21 is a packaging structure, and the second electronic element 22 is an active element.

Furthermore, the protective structure 25, 25' can be disposed between the active surface 21a of the first electronic element 21 and the carrier 20 and between the active surface 22a of the second electronic element 22 and the carrier 20 as needed. In other words, besides the protective structure 25 disposed in the space S of the carrier 20, the protective structure 25' is also disposed between the first or second electronic element 21, 22 and the carrier 20, and on the peripheral region B of the carrier 20.

Figure 2C:
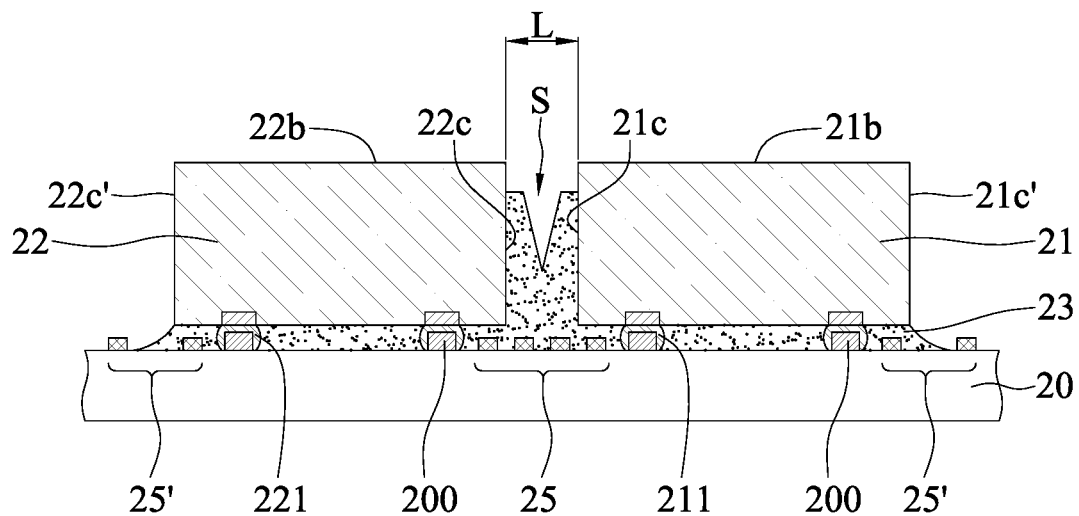

Referring to FIG. 2C, a filling material 23 is formed between the carrier 20 and the first electronic element 21 and between the carrier 20 and the second electronic element 22 so as to encapsulate the conductive bumps 211, 221 and the protective structure 25.

In an embodiment, the filling material 23 is such as an underfill, which is further formed in the space S between the first electronic element 21 and the second electronic element 22. Specifically, the filling material 23 extends onto a side surface 21c of the first electronic element 21 corresponding to the space S and a side surface 22c of the second electronic element 22 corresponding to the space S due to a capillary action. As such, the smaller the width L (i.e., the distance between the first electronic element 21 and the second electronic element 22) of the space S (or the smaller the spacing), the more obvious the capillary phenomenon of the filling material 23 in the space S.

Further, if the protective structure 25' is disposed on the peripheral region B, the filling material 23 can encapsulate a portion of the protective structure 25' of the peripheral region B.

Furthermore, referring to FIG. 2C', the height h1 of the conductive pads 200 of the carrier 20 relative to a surface of the carrier 20 is greater than the height h2 of the protective structure 25' of the peripheral region B relative to the surface of the carrier 20. For example, there is a height difference t of 3 um therebetween. As such, when being bonded to the conductive pads 200, the plurality of conductive bumps 211, 221 close to the peripheral region B are prevented from coming into contact with the protective structure 25' that would otherwise cause a short circuit. It should be understood that the height h1 of the conductive pads 200 relative to the surface of the carrier 20 can also be greater than the height of the protective structure 25 corresponding in the space S relative to the surface of the carrier 20.

Figure 2D:
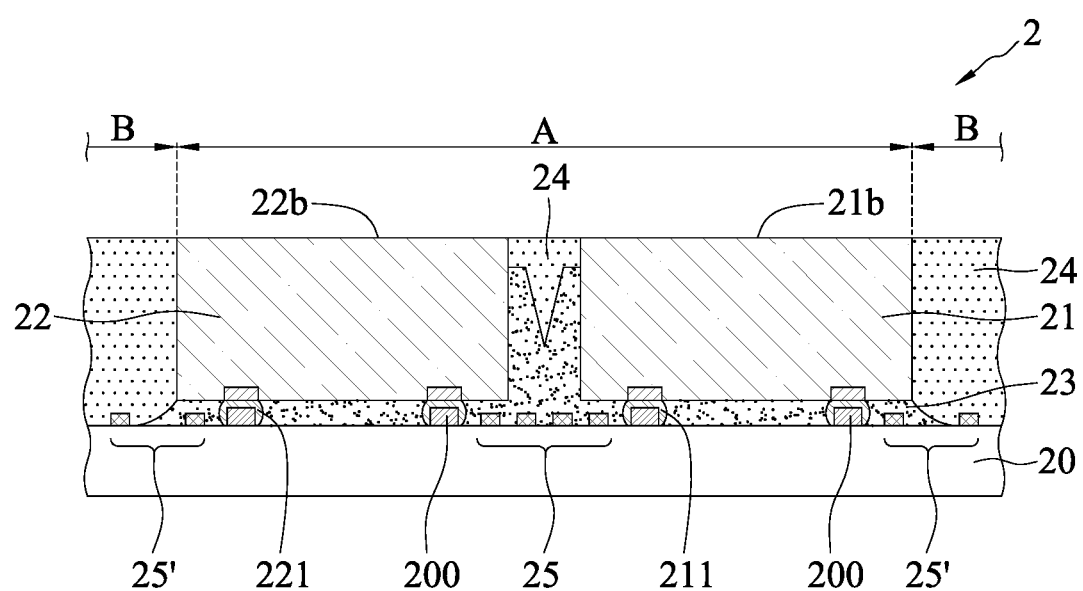
Figure 2D:
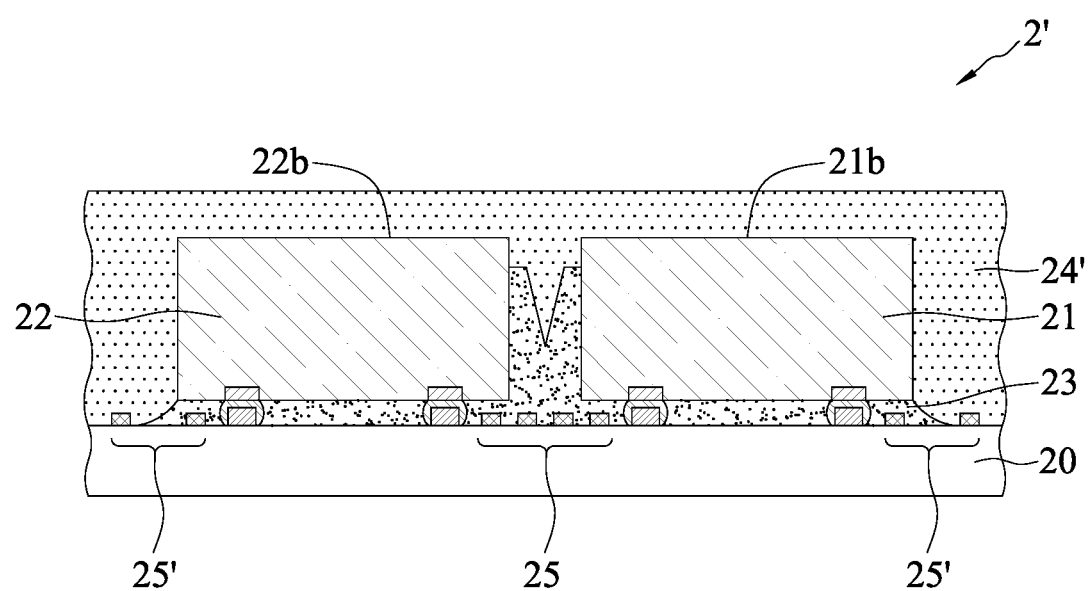

Referring to FIG. 2D, an encapsulant 24 is formed on the carrier 20 and in the space S for encapsulating the first electronic element 21 and the second electronic element 22.

In an embodiment, the encapsulant 24 can fill the space S by lamination or molding. Specifically, the encapsulant 24 covers the inactive surface 21b of the first electronic element 21 and the inactive surface 22b of the second electronic element 22 first and then extends to fill the space S. Thereafter, the encapsulant 24 is partially removed by grinding or cutting (the inactive surface 21b of the first electronic element 21 and the inactive surface 22b of the second electronic element 22 can be partially removed as needed) so as to cause an upper surface of the encapsulant 24 to be flush with the inactive surface 21b of the first electronic element 21 and the inactive surface 22b of the second electronic element 22.

Further, the Young's modulus of the encapsulant 24 is less than that of the filling material 23. For example, the encapsulant 24 is made of an insulating material such as polyimide, a dry film, an epoxy resin, a molding compound, a photoresist material or a solder mask.

In another embodiment, referring to FIG. 2D', the encapsulant 24' can further cover the inactive surface 21b of the first electronic element 21 and the inactive surface 22b of the second electronic element 22.

According to the method of the present disclosure, the protective structure 25 is disposed between the first electronic element 21 and the second electronic element 22 on the carrier 20 so as to prevent problems such as uneven stress distribution or stress concentration caused by coefficient of thermal expansion (CTE) mismatch of the filling material 23, for example, cracks caused by excessive stresses extending into the redistribution layer of the carrier 20. Therefore, compared with the prior art, the present disclosure prevents electrical failure of the final product of the electronic package 2 due to cracking of the conductive pads 200.

Further, the protective structure 25, 25' has at least one hollow portion 250 (the mesh of FIG. 2A' or gap of FIG. 2A") exposing the carrier 20 so as to facilitate the contact and the bonding between the filling material 23 and the carrier 20, thereby preventing delamination of the protective structure 25, 25' and the carrier 20. It should be understood that delamination of the protective structure 25, 25' and the dielectric layer (e.g., polyimide) of the carrier 20 can be prevented due to a good adhesion between the filling material 23 (underfill) and the dielectric layer (e.g., polyimide) of the carrier 20.

In addition, by disposing the protective structure 25' on the peripheral region B, the stress distribution can be more effectively dispersed (generally, maximum stresses are located on corners of a chip) so as to prevent stress concentration on corners of the chip mounting region A (such as the first electronic element 21 and/or the second electronic element 22), thereby preventing cracking of the first electronic element 21 and/or the second electronic element 22. For example, the distance D between layout area of the protective structure 25' and a side surface 22c' of the second electronic element 22 corresponding to the peripheral region B (or a side surface 21c' of the first electronic element 21 corresponding to the peripheral region B) is at least 25 um, i.e., D≥25 um. Preferably, the layout area of the protective structure 25, 25' (disposed on the chip mounting region A and the peripheral region B) is greater than the vertical projection area of the first electronic element 21 on the carrier 20 (e.g., the area of the active surface 21a of the first electronic element 21, which is only positioned on the chip mounting region A) and/or the vertical projection area of the second electronic element 22 on the carrier 20 (e.g., the area of the active surface 22a of the second electronic element 22, which is only positioned on the chip mounting region A).

The present disclosure further provides an electronic package 2, 2', which comprises: a carrier 20, a first electronic element 21, a second electronic element 22, a protective structure 25 and a filling material 23.

The first electronic element 21 and the second electronic element 22 are intervally disposed on the carrier 20 with a space S defined (formed) between the first electronic element 21 and the second electronic element 22.

The protective structure 25 is disposed on the carrier 20 and positioned between the first electronic element 21 and the second electronic element 22.

The filling material 23 is formed on the carrier 20 and in the space S and encapsulates the protective structure 25.

In an embodiment, the first electronic element 21 and the second electronic element 22 are electrically connected to the carrier 20.

In an embodiment, the protective structure 25 is a metal structure.

In an embodiment, the protective structure 25 is in the form of a mesh or a plurality of blocks.

In an embodiment, the protective structure 25 has at least one hollow portion 250 exposing the carrier 20.

In an embodiment, the carrier 20 has a plurality of conductive pads 200 electrically connected to the first electronic element 21 and/or the second electronic element 22, and the height h1 of the conductive pads 200 relative to a surface of the carrier 20 is greater than the height h2 of the protective structure 25, 25' relative to the surface of the carrier 20.

In an embodiment, the carrier 20 is defined with a chip mounting region A and a peripheral region B surrounding the chip mounting region A, the first electronic element 21 and the second electronic element 22 are disposed in the chip mounting region A, and the protective structure 25' is further disposed on the peripheral region B. For example, the layout area of the protective structure 25, 25' is greater than the vertical projection area of the first electronic element 21 on the carrier 20 and/or the vertical projection area of the second electronic element 22 on the carrier 20.

In an embodiment, the electronic package 2, 2' further comprises an encapsulant 24, 24' formed on the carrier 20 for encapsulating the first electronic element 21 and the second electronic element 22. For example, the first electronic element 21 and/or the second electronic element 22 are exposed from the encapsulant 24.

According to the electronic package and the fabrication method thereof of the present disclosure, the protective structure is positioned between the first electronic element and the second electronic element on the carrier so as to disperse stress distribution, thereby reducing stresses generated inside the first electronic element and the second electronic element by the filling material. Compared with the prior art, the present disclosure prevents cracking of the first electronic element and the second electronic element and improves the reliability of the electronic package.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims

What is claimed is:

1. A method for fabricating an electronic package, comprising:
    disposing a first electronic element and a second electronic element intervally on a carrier having a protective structure, wherein a space is formed between the first electronic element and the second electronic element, and the protective structure is positioned between the first electronic element and the second electronic element; and
    forming a filling material on the carrier and in the space and encapsulating the protective structure.

2. The method of claim 1, wherein the first electronic element and the second electronic element are electrically connected to the carrier.

3. The method of claim 1, wherein the protective structure is a metal structure.

4. The method of claim 1, wherein the protective structure is in a form of a mesh or a plurality of blocks.

5. The method of claim 1, wherein the protective structure has at least one hollow portion exposing the carrier.

6. The method of claim 1, wherein the carrier has a plurality of conductive pads electrically connected to at least one of the first electronic element and the second electronic element, and a height of the conductive pads relative to a surface of the carrier is greater than a height of the protective structure relative to the surface of the carrier.

7. The method of claim 1, wherein the carrier is defined with a chip mounting region and a peripheral region surrounding the chip mounting region, such that the first electronic element and the second electronic element are disposed in the chip mounting region and the protective structure is further disposed on the peripheral region.

8. The method of claim 7, wherein a layout area of the protective structure is greater than a vertical projection area of at least one the first electronic element and the second electronic element on the carrier.

9. The method of claim 1, further comprising forming an encapsulant on the carrier for encapsulating the first electronic element and the second electronic element.

10. The method of claim 9, wherein at least one of the first electronic element and the second electronic element are exposed from the encapsulant.

* * * * *